(12) United States Patent
Kalnitsky et al.

(10) Patent No.: US 6,593,200 B2
(45) Date of Patent: Jul. 15, 2003

(54) METHOD OF FORMING AN INTEGRATED INDUCTOR AND HIGH SPEED INTERCONNECT IN A PLANARIZED PROCESS WITH SHALLOW TRENCH ISOLATION

(75) Inventors: Alexander Kalnitsky, Portland, OR (US); Dmitri A. Choutov, San Jose, CA (US); Geoffrey C. Stutzin, San Carlos, CA (US); Robert F. Scheer, Portland, OR (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

(21) Appl. No.: 09/989,649

(22) Filed: Nov. 20, 2001

(65) Prior Publication Data

US 2003/0096487 A1 May 22, 2003

(51) Int. Cl.⁷ .............................................. H01L 21/331
(52) U.S. Cl. ........................ 438/363; 438/360; 438/363
(58) Field of Search ................................ 438/637–640, 438/672–675, 618, 622

(56) References Cited

U.S. PATENT DOCUMENTS 6,169,008 B1 * 1/2001 Wen et al. .................. 257/531

* cited by examiner

Primary Examiner—David Nelms
Assistant Examiner—Dung Anh Le
(74) Attorney, Agent, or Firm—Blakely, Sokoloff, Taylor & Zafman LLP

(57) ABSTRACT

A method of forming a semiconductor device with an inductor and/or high speed interconnect. The method comprises forming an epitaxial layer over the substrate, forming an opening through the epitaxial layer to expose an underlying region of the substrate, forming a first dielectric material within the opening of the epitaxial layer, planarizing the first dielectric layer, forming a second dielectric material layer over the first dielectric material layer, and then forming a metallized inductor over the second dielectric material layer above the opening of the epitaxial layer. In this case, since the inductor and the high speed interconnect do not overlie the conductive epitaxial layer, the degradation in the Q-factor of the inductor, loss characteristics of the high speed interconnect, and 'cross-talk' between conductors are substantially reduced. The resulting semiconductor device is also disclosed.

17 Claims, 4 Drawing Sheets

METHOD OF FORMING AN INTEGRATED INDUCTOR AND HIGH SPEED INTERCONNECT IN A PLANARIZED PROCESS WITH SHALLOW TRENCH ISOLATION

FIELD OF THE INVENTION

This invention relates generally to semiconductor processing, and in particular, to a method of forming an integrated inductor and/or high speed interconnect in a planarized process with shallow trench isolation.

BACKGROUND OF THE INVENTION

Inductors are often employed in integrated circuits to perform specific functions according to the requirements of the circuits. Such functions include, for example, providing inductive reactance in filters and resonators, etc. An important parameter of an inductor relates to its loss characteristics, usually referred to as the quality factor (i.e. Q) of the inductor. Generally, it is desirable for an inductor to have low loss characteristics (or conversely, high Q characteristics). The higher the Q-factor of an inductor, generally the more ideal its impact is on the desired signal it is acting upon. Often inductors are combined with a capacitor to create a filter or resonator.

For example in a bandpass filter the goal is to pass signals in a selected range of frequencies, known as the "passband", while blocking signals outside of this range. A high Q inductor in a bandpass filter allows signals in the passband to experience less loss while signals outside of this range experience more attenuation. In an oscillator, a high Q inductor is required to realize a high Q resonator. Practical benefits of a high Q resonator are better frequency stability and less unwanted spurious signals generated along with the desired signal. These unwanted spurious signals give rise to phase noise, which is an important limiting factor in digital radio performance.

Interconnects are generally used in RF integrated circuits (RFIC's) for digital radio applications and High Speed Digital (HSD) circuits for fiber-optic interface circuits. At frequencies above 1 GHz, these interconnects act more as transmission lines which guide traveling electromagnetic waves along a desired path versus the more simplistic low frequency concept of a wire carrying current from one part of a circuit to another. Similar to an inductor, the quality of an interconnect is highly influenced by its loss characteristics and noise immunity of the medium within which it resides. Lower loss interconnects reduce the gain requirements for RFICs, thereby reducing their power consumption. The lower loss interconnect in fiber-optic ICs reduces signal distortion and allows for higher frequency of operation. Increased noise immunity results in greater signal sensitivity in RFICs and reduced timing jitter in fiber-optic interface ICs.

Many factors can affect the Q of an inductor and loss characteristics of an interconnect. For instance, the conductivity of the metallization forming the inductor has an impact on the Q-factor of an inductor. Generally, the higher the conductivity of the metallization forming an inductor, the higher Q-factor of the inductor. Conversely, the lower the conductivity of an inductor, the lower the Q-factor of the inductor. Another factor that affects the Q-factor of an inductor is the proximity of another conductive layer to the inductor, since currents can be generated in this layer due to magnetic coupling to the inductor. These are known as "eddy" currents. In many semiconductors, the conductive layer is actually more like a sheet of moderately resistive material. These eddy currents dissipate power in this layer due to ohmic losses and hence remove energy from the inductor, which lowers its Q.

Similarly interconnects experience losses when layers of moderate conductivity are in close proximity, due to the same eddy current generation. This leads to increased insertion loss, which is undesirable. The presence of a moderately conductive layer underneath the high speed interconnect also provides a path way for spurious signals from adjacent interconnect to enter the main high speed signal line. This results in undesired cross-talk noise and is particularly problematic at frequencies above 1 GHz. The absence of the conductive layer underneath the high speed interconnect reduces this cross-talk effect considerably thus increasing noise immunity.

Hence, for both inductors and interconnects the elimination of moderate conductivity layers in the region below these structures improves performance. Specifically removal of this layer improves inductor Q and decreases the insertion loss of interconnects. In both cases the benefit increases with frequency, particularly above 1 GHz.

Integrated inductors are often used in radio frequency (RF) bipolar and BiCMOS technologies. However, these technologies typically incorporate a layer of low resistivity epitaxial silicon. Thus, forming an inductor proximate a low resistivity epitaxial silicon layer typically degrades the Q-factor of the inductor, which is undesirable. Similarly, high speed interconnect proximate a low resistivity epitaxial silicon layer degrades the insertion loss of the interconnect. The following explains the prior art high speed bipolar and BICMOS processes and illustrates the proximity of the epitaxial silicon layer to the inductor and the interconnect, which has undesirable consequences.

FIG. 1A illustrates a cross-sectional view of a semiconductor device 100 at an intermediate step of a prior art method of forming a bipolar or BICMOS semiconductor. At this step, the conductor device 100 consists of a substrate 102 and a mask layer 104 including an opening 106 to define underneath a buried implant region 108 of the substrate 102. At this step, the semiconductor device 100 is undergoing an ion implanation process to form the buried implant region 108 of the substrate 102. The buried implant region 108 defines at least a portion of an active device being formed.

FIG. 1B illustrates a cross-sectional view of the semiconductor device 100 at a subsequent step of the prior art method of forming a bipolar or BICMOS semiconductor. In this step, the mask layer 104 is removed. Then, a layer of low resistivity epitaxial silicon 110 is formed over the substrate 102 and the buried implant region 108 of the substrate 102.

FIG. 1C illustrates a cross-sectional view of the semiconductor device 100 at a subsequent step of the prior art method of forming a bipolar or BICMOS semiconductor. In this step, a shallow trench 112 is formed by removing a top portion of the low resistivity epitaxial silicon layer 110. Also in this step, the active components can be formed.

FIG. 1D illustrates a cross-sectional view of the semiconductor device 100 at a subsequent step of the prior art method of forming a bipolar or BICMOS semiconductor. In this step, an intermetal dielectric layer 114 is formed over the low resistivity epitaxial silicon layer 110 and within the shallow trench 112. After forming the intermetal dielectric layer 114, an inductor and/or an interconnect 116 is formed over the intermetal dielectric layer 114. As FIG. 1D illustrates, the inductor and/or the interconnect 116 is situated over the low resistivity epitaxial silicon layer 110. Since the layer 110 is electrically conductive, it degrades the Q-factor of the inductor and/or the interconnect 116, which is undesirable especially for RF applications.

Thus, there is a need for a method of forming a semiconductor device (such as a bipolar or BICMOS device) including an inductor and/or an interconnect that is not situated over a conductive layer in order to prevent degradation of the Q-factor of the inductor and/or improve noise isolation properties and loss characteristics of the interconnect. Such a need and others are met with the method of forming a semiconductor device in accordance with the invention.

SUMMARY OF THE INVENTION

A first aspect of the invention relates to a method of forming a semiconductor device with inductor. The method comprises forming an epitaxial layer over the substrate, forming an opening through the epitaxial layer to expose an underlying region of the high resistivity (relative to the epi resistivity) substrate, forming a first dielectric material within the opening of the epitaxial layer, planarizing the first dielectric layer, forming a second dielectric material layer over the first dielectric material layer, and then forming a metallized inductor and/or a high speed interconnect over the second dielectric material layer above the opening of the epitaxial layer. In this case, since the inductor and/or the high speed interconnect do not overlie the conductive epitaxial layer, the degradation in the Q-factor of the inductor is substantially reduced as is the loss and 'cross-talk' between interconnect lines.

According to a more specific implementation of the method, the planarizing of the first dielectric layer may be performed by chemical-mechanical polishing (CMP). If such is the case, a CMP stop material may be provided over the epitaxial layer to prevent the erosion of the epitaxial layer due to the CMP process. Also, according to the more specific implementation of the method, the substrate can comprise silicon or other materials, the epitaxial layer can comprise a low resistivity silicon material or other electrically-conductive materials, the first dielectric layer can comprise a silicon dioxide or other electrically-insulating materials, the CMP stop material can comprise a nitride-oxide (NO) stack or other suitable materials, and the second dielectric layer can also comprise a silicon dioxide or other electrically-insulating material, and can serve as an intermetal dielectric for the semiconductor device.

Another aspect of the invention relates to the resulting semiconductor device made in accordance with the method of the invention. The semiconductor device comprises a substrate, an epitaxial layer formed over the substrate, wherein the epitaxial layer includes an opening, a first dielectric layer situated within said opening of said epitaxial layer, a second dielectric layer disposed over the first dielectric layer, and a metallized inductor and/or an interconnect formed over said second dielectric layer above the opening of said epitaxial layer. Again, since the inductor and/or interconnect do not overlie the conductive epitaxial layer, the degradation in the Q-factor of the inductor is substantially reduced.

Other aspects, features and techniques of the invention will become apparent to one skilled in the relevant art in view of the following detailed description of the invention.

DETAILED DESCRIPTION OF THE INVENTION

Figure 1:
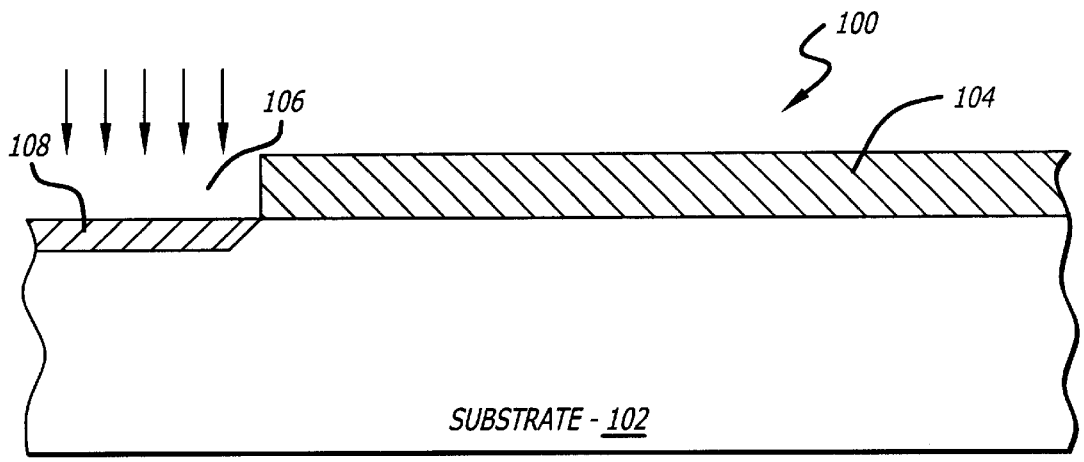
FIG. 1A illustrates a cross-sectional view of a semiconductor device at an intermediate step of a prior art method of forming a semiconductor device with an inductor and/or interconnect.
FIG. 1B illustrates a cross-sectional view of the semiconductor device at a subsequent step of the prior art method of forming a semiconductor device with an inductor and/or interconnect.
FIG. 1C illustrates a cross-sectional view of the semiconductor device at a subsequent step of the prior art method of forming a semiconductor device with an inductor and/or interconnect.
FIG. 1D illustrates a cross-sectional view of the semiconductor device at a subsequent step of the prior art method of forming a semiconductor device with an inductor and/or interconnect.
Figure 1B:
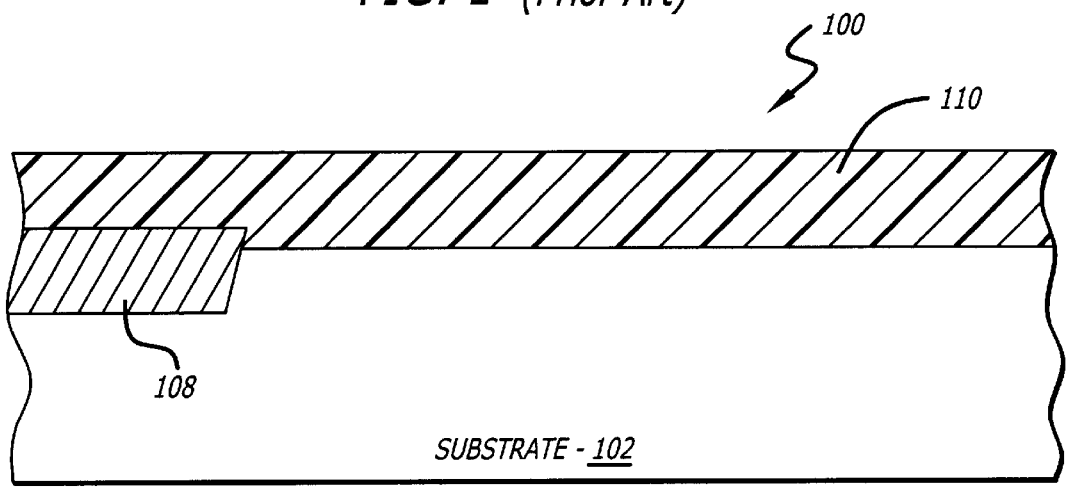
Figure 1C:
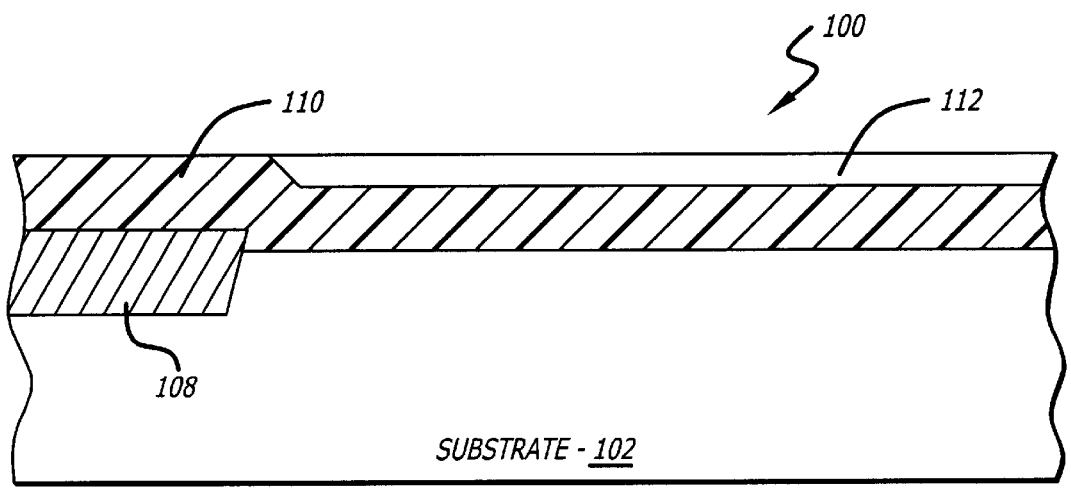
Figure 1D:
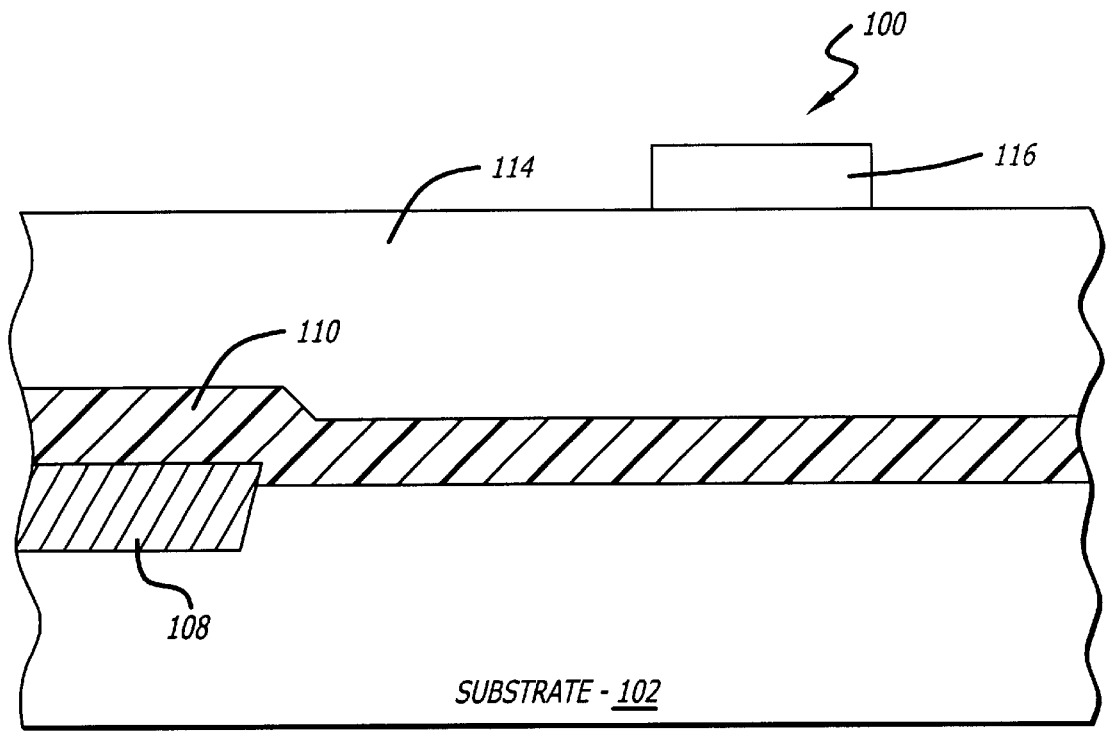
Figure 2A:
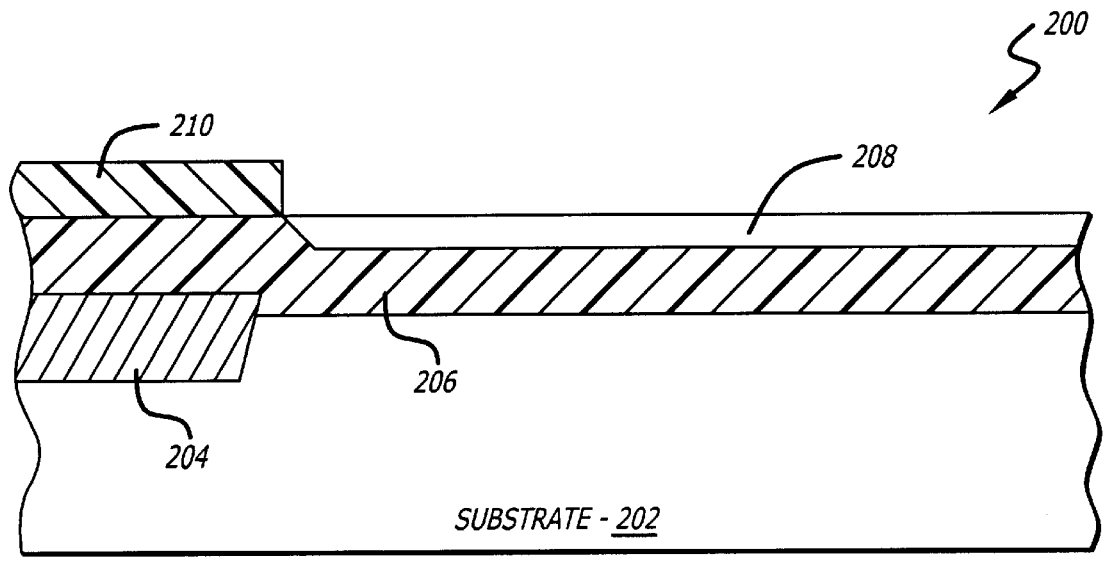
FIG. 2A illustrates a cross-sectional view of a semiconductor device at an intermediate step of a method of forming a semiconductor device with an inductor and/or interconnect in accordance with the invention.

FIG. 2A illustrates a cross-sectional view of a semiconductor device 200 at an intermediate step of a method of forming a semiconductor device with an inductor and/or interconnect in accordance with the invention. At this step, the semiconductor device 200 comprises a silicon substrate 202 having a buried implant region 204, a low resistivity epitaxial silicon layer 206 formed over the substrate 202 including the buried implant region 204, and a chemical-mechanical polishing (CMP) stop material 210 (e.g. a nitride-oxide stack). The epitaxial silicon layer 206 includes a shallow trench 208 at its top surface at a region not overlying the buried implant region 204 of the substrate 202.

Figure 2B:
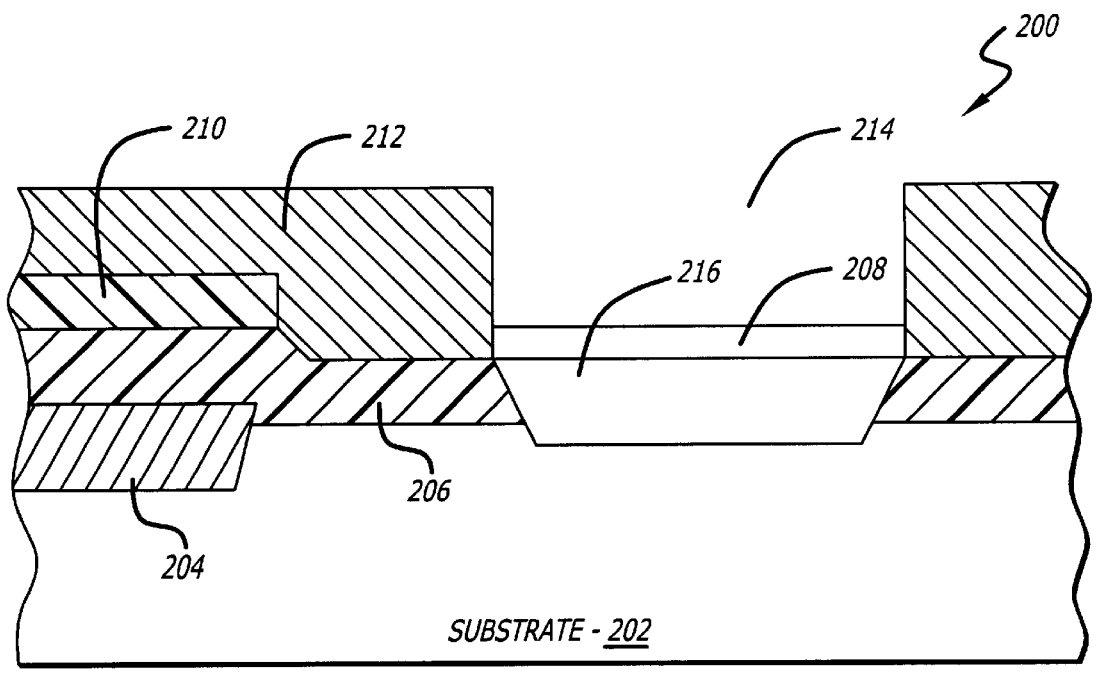
FIG. 2B illustrates a cross-sectional view of the semiconductor device at a subsequent step of the method of forming a semiconductor device with an inductor and/or interconnect in accordance with the invention.

FIG. 2B illustrates a cross-sectional view of the semiconductor device 200 at a subsequent step of the method of forming a semiconductor device with an inductor and/or interconnect in accordance with the invention. In this step, a photo resist mask 212 is formed over the CMP stop material 210 and the epitaxial silicon layer 206 including the shallow trench 208, and developed and patterned to form an opening 214 over the shallow trench 208 to expose the underlying epitaxial silicon layer 206. Then the epitaxial silicon layer 206 underlying the mask opening 214 is etched off to form an opening 216 through the epitaxial silicon layer 206, thereby exposing the underlying substrate 202.

Figure 2C:
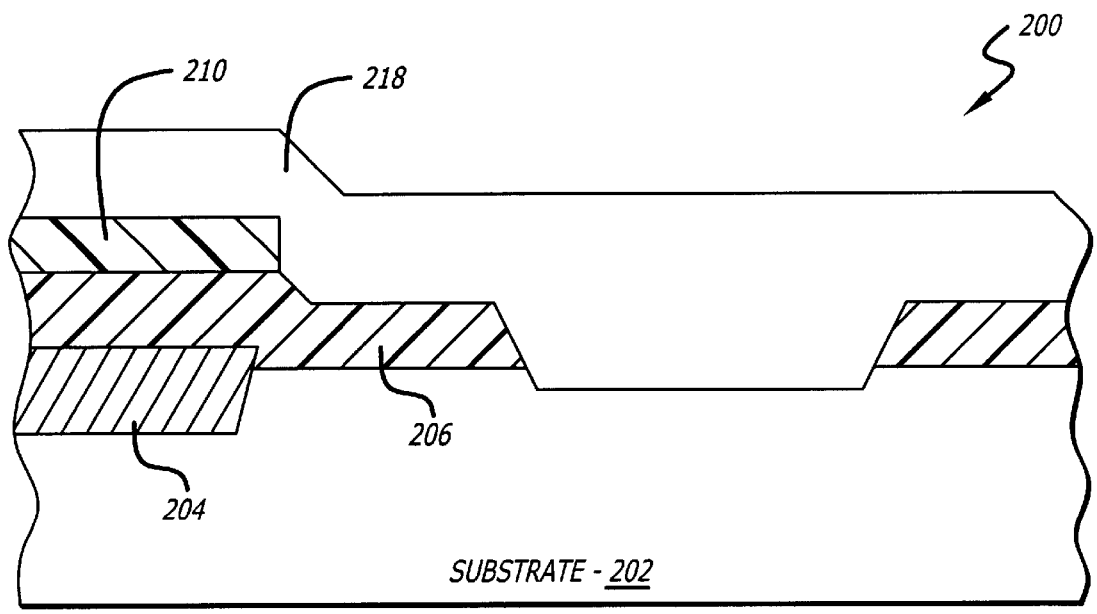
FIG. 2C illustrates a cross-sectional view of the semiconductor device at a subsequent step of the method of forming a semiconductor device with an inductor and/or interconnect in accordance with the invention.

FIG. 2C illustrates a cross-sectional view of the semiconductor device 200 at a subsequent step of the method of forming a semiconductor device with an inductor and/or interconnect in accordance with the invention. In this step, the mask layer 212 is removed and a silicon dioxide layer 218 is deposited over the substrate 202 within the opening 216 in the epitaxial silicon layer 206, and above the epitaxial silicon layer 206 and the CMP stop material 210.

Figure 2D:
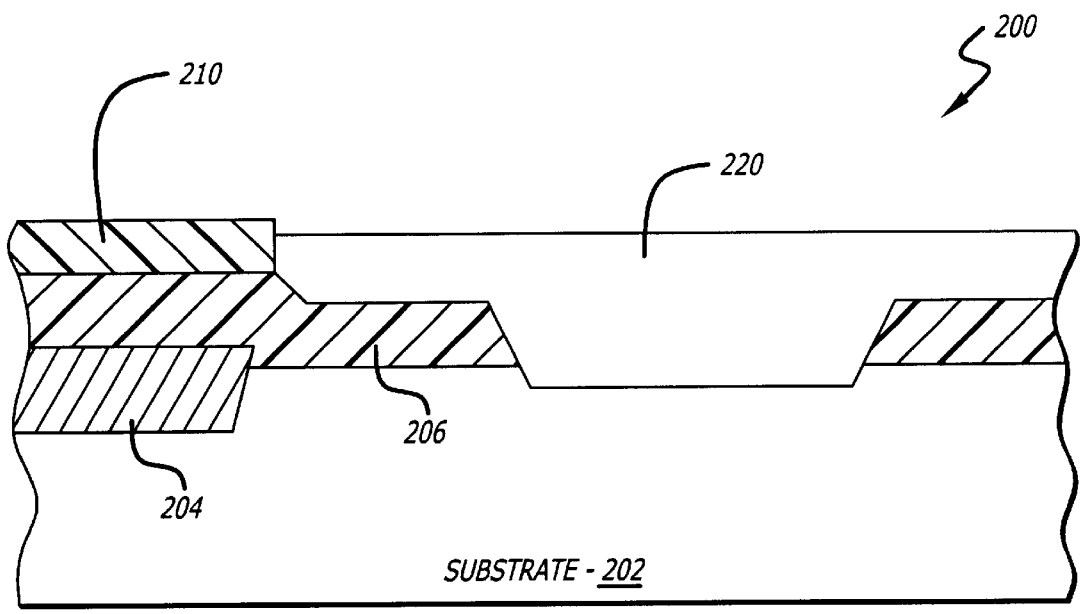
FIG. 2D illustrates a cross-sectional view of the semiconductor device at a subsequent step of the method of forming a semiconductor device with an inductor and/or interconnect in accordance with the invention.

FIG. 2D illustrates a cross-sectional view of the semiconductor device 200 at a subsequent step of the method of forming a semiconductor device with an inductor and/or interconnect in accordance with the invention. In this step, the silicon dioxide layer 218 is subjected to a chemical-mechanical polishing (CMP) process to planarize the top region of the silicon dioxide layer 218 to form a planarized silicon dioxide layer 220. In this case, the CMP stop material 210 resists the chemical-mechanical polishing of the material, thereby serving to protect the underlying epitaxial silicon layer 206 as well as an indication of when to stop the chemical-mechanical polishing of the silicon dioxide layer 218.

Figure 2E:
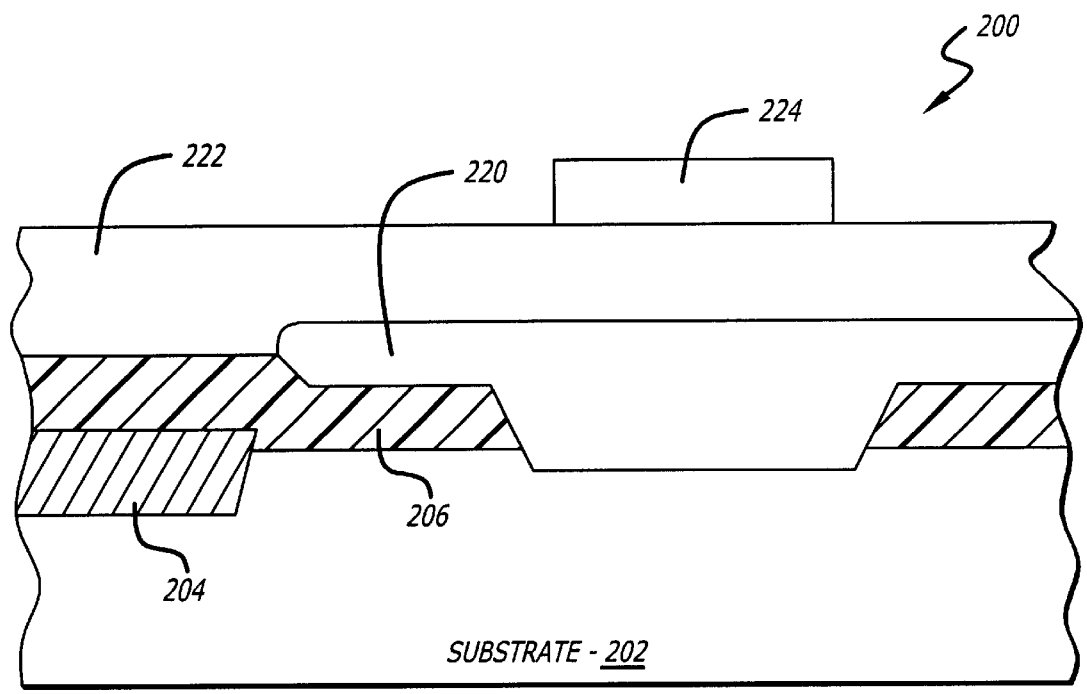
FIG. 2E illustrates a cross-sectional view of the semiconductor device at a subsequent step of the method of forming a semiconductor device with an inductor and/or interconnect in accordance with the invention.

FIG. 2E illustrates a cross-sectional view of the semiconductor device 200 at a subsequent step of the method of forming a semiconductor device with an inductor and/or interconnect in accordance with the invention. In this step, the CMP stop material 210 is removed and an intermetal dielectric layer 222 (e.g., silicon dioxide) is formed over the epitaxial silicon layer 206 and the silicon dioxide fill 220. Then, a metallized inductor and/or interconnect 224 is formed over the intermetal dielectric layer 222 directly above the silicon dioxide fill 220 and opening 216. In this way, the inductor and/or interconnect 224 does not overlie the conductive epitaxial silicon layer 206, and thus the Q-factor of the inductor and/or the interconnect 224 is not degraded as would be if the layer 206 were situated below the inductor 224.

In the case where the substrate 102 is doped to a degree that it is relatively electrically conductive, there still remains an electrically conductive material below the inductor and/or interconnect 224. Thus, the Q of the inductor and/or interconnect may further be affected by the conductive substrate 102. To ameliorate this problem, the forming of the opening 216 in the epitaxial silicon layer 206 as discussed with reference to FIG. 2B, can be extended to remove a portion of the conductive substrate 202 below the opening 216. Then, the deposition of the silicon dioxide layer 218, as discussed with reference to FIG. 2C, can be deposited within the removed portion of the conductive substrate 202. In this way, the portion of the conductive substrate 202 situated below the inductor and/or interconnect 224 is further away from the inductor and/or interconnect 224, thereby reducing its effect on the Q of the inductor and/or interconnect 224.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

It is claimed:

1. A method of forming a semiconductor device with a metallized inductor and/or interconnect, comprising:
   providing a high resistivity substrate;
   forming a low resistivity epitaxial layer over said substrate;
   forming an opening through a first region of said epitaxial layer to expose an underlying region of said substrate;
   filling said opening through said epitaxial layer with a first dielectric material;
   planarizing said first dielectric material;
   forming a second dielectric material layer over said first dielectric material; and
   forming said metallized inductor and/or said interconnect over said first dielectric material within said opening of said epitaxial layer.

2. The method of claim 1, wherein planarizing said first dielectric material comprises chemical-mechanical polishing (CMP) of said first dielectric material.

3. The method of claim 2, further comprising forming a CMP stop material over a second region of said epitaxial layer to protect said second region of said epitaxial layer from said chemical-mechanical polishing (CMP).

4. The method of claim 3, wherein said CMP stop material comprises a nitride-oxide stack.

5. The method of claim 1, further comprising forming a buried implant region within said substrate.

6. The method of claim 1, wherein said substrate comprises silicon.

7. The method of claim 1, wherein said epitaxial layer comprises silicon.

8. The method of claim 1, wherein said first dielectric layer comprises silicon dioxide.

9. The method of claim 1, wherein said second dielectric layer comprises an intermetal dielectric layer.

10. A method of forming a semiconductor device with a metallized inductor and/or interconnect, comprising:
    providing a substrate;
    forming an epitaxial layer over said substrate;
    forming a through-opening within a first region of said epitaxial layer;
    filling said opening of said epitaxial layer with a first dielectric material; and
    forming said metallized inductor and/or interconnect over said first dielectric material within said opening of said epitaxial layer.

11. The method of claim 10, further comprising planarizing said first dielectric material.

12. The method of claim 11, wherein planarizing said first dielectric material comprises chemical-mechanical polishing (CMP) of said first dielectric material.

13. A method of forming a semiconductor device with a metallized inductor and/or interconnect, comprising:
    providing a substrate;
    forming an epitaxial layer over said substrate;
    forming a through opening within a first region of said epitaxial layer;
    filling said opening of said epitaxial layer with a first dielectric material;
    forming said metallized inductor and/or interconnect over said first dielectric material within said opening of said epitaxial layer; and
    forming a CMP stop material over a second region of said epitaxial layer to protect said second region of said epitaxial layer from said chemical-mechanical polishing (CMP).

14. The method of claim 13, wherein said CMP stop material comprises a nitride-oxide stack.

15. A method of forming a semiconductor device with a metallized inductor and/or interconnect, comprising:
    providing a substrate;
    forming an epitaxial layer over said substrate;
    forming a through opening within a first region of said epitaxial layer;
    filling said opening of said epitaxial layer with a first dielectric material;
    forming said metallized inductor and/or interconnect over said first dielectric material within said opening of said epitaxial layer; and forming a second dielectric layer between said metallized inductor and/or interconnect and said first dielectric layer.

16. The method of claim 15 wherein said second dielectric layer comprises an intermetal dielectric layer.

17. A method of forming a semiconductor device with a metallized inductor and/or interconnect, comprising:

provide a substrate;

forming a low resistivity epitaxial layer over said substrate;

forming an opening through a first region of said epitaxial layer to expose an underlying region of said substrate;

removing a portion of said substrate below said opening of said epitaxial layer;

filling said opening through said epitaxial layer and said removed portion of said substrate with a first dielectric material;

planarizing said first dielectric material;

forming a second dielectric material layer over said first dielectric material; and forming said metallized inductor and/or said interconnect over said first dielectric material within said opening of said epitaxial layer.

* * * * *